United States Patent [19]

Oberlin

[11] Patent Number: 6,005,449
[45] Date of Patent: Dec. 21, 1999

[54] ULTRA LOW-POWER FAST START PRECISION RC OSCILLATOR

[75] Inventor: Richard P. Oberlin, Phoenix, Md.

[73] Assignee: AAI Corporation, Cockeysville, Md.

[21] Appl. No.: 09/001,690

[22] Filed: Dec. 31, 1997

[51] Int. Cl.[6] ............................................. H03K 3/0231
[52] U.S. Cl. ........................ 331/140; 331/143; 331/185
[58] Field of Search ................................. 331/111, 143, 331/185, 135, 140

[56] References Cited

U.S. PATENT DOCUMENTS

| | | | |
|---|---|---|---|
| 4,450,518 | 5/1984 | Klee | 331/1 A |
| 4,530,321 | 7/1985 | Caron et al. | 123/179.21 |
| 4,667,171 | 5/1987 | Matthys | 331/111 |
| 5,182,528 | 1/1993 | Zuta | 331/1 A |
| 5,272,327 | 12/1993 | Mitchell et al. | 250/205 |
| 5,508,664 | 4/1996 | Rizzo | 331/143 |

Primary Examiner—Siegfried H. Grimm
Attorney, Agent, or Firm—Venable; Catherine A. Ferguson

[57] ABSTRACT

An ultra-low power, fast start fuze oscillator contained in a fast moving projectile which contains a programmable projectile fuze. It is an RC oscillator which uses a low power comparator, three biasing resistors, a timing resistor and a timing capacitor to produce an output frequency as low as 8 kHz with a frequency error of less than ±0.1% over a −40° C. to +60° C. temperature range. At the same time, it is capable of surviving a high g environment (30,000 g to 60,000 g) in a reliable manner. Furthermore, the oscillator draws a very low amount of power, using a maximum of about 20 uA of current and has a start-up time limited to a maximum of 1.5 msec. An additional circuit can be connected to the positive supply voltage input of a lower current version of an RC oscillator to jump start the RC oscillator, thereby improving start-up time to 1.5 msec while reducing the current drain to 15 uA.

5 Claims, 5 Drawing Sheets

SOLID LINE = 3.5v
DASHED LINE = 3.0v

SOLID LINE = FREQ. ERROR
DOTTED LINE = PROPORTIONAL OUTPUT AMPLITUDE

SOLID LINE = MAX882 DIODE COMPENSATION
DASH-DOT LINE = THEORETICAL DIODE COMPENSATION

ULTRA LOW-POWER FAST START PRECISION RC OSCILLATOR

CROSS REFERENCE TO RELATED APPLICATIONS

This application is related to the following applications: "One-Shot High-Output Piezoid Power Supply" (Ser. No. 09/001,687) by Richard P. Oberlin and Robert T. Soranno; "Accurate Ultra Low-Power Fuze Electronics" (Ser. No. 09/002,247) by Richard P. Oberlin and Robert T. Soranno; "Self Correcting Inductive Fuze Setter" (Ser. No. 09/001,693) by Richard P. Oberlin and Robert T. Soranno; and "Piezoid Electrical Gun Trigger" (Ser. No. 09/001,688) by Richard P. Oberlin, each of which is filed concurrently herewith, commonly owned, and incorporated herein by reference.

BACKGROUND OF THE INVENTION

The present invention relates to a new and improved highly accurate, low power low speed fuze oscillator contained in a fast moving projectile which contains a programmable projectile fuze.

The timing accuracy requirement for modern projectiles is on the order of ±0.1% over wide climatic conditions in order to obtain a high probability of kill on the desired target and to limit undesired damage to adjacent structures or personnel. In a short-barrel/high-speed/high-accuracy weapon, the time between set-back and muzzle exit (when timing should start) is typically only 2 to 3 msec. In addition, set-back imposes an acceleration stress of 30,000 to 60,000 g's on the fuze.

Pyrotechnic devices have been used extensively in the past, but are unable to attain the required accuracy, especially over temperature extremes.

Analog timing circuits have also been used. While they are more accurate than pyrotechnic devices, they also have trouble in reliably meeting the stated accuracy.

Digital count down circuits have, for the most part, replaced other approaches. The primary contributor to accuracy error is the oscillator used to clock the digital circuits. Crystal oscillators can easily provide the accuracy required, but suffer from a typical start up period of several to tens of microseconds and have trouble surviving the high g environment (30,000 g to 60,000 g) in a reliable manner.

On the other hand, ceramic resonators are bulk devices that can readily take the high g environment and, also, can start up ten times faster than crystals. However, their accuracy is poor. They have tolerances of about ±0.25% individually for set, temperature drift and aging (which together results in an SRSS error of about ±0.43%). Also, ceramic oscillators can not be used at frequencies below about 80 kHz.

RC oscillators exist in the prior art for use at frequencies below 80 kHz, but none are available that can meet the accuracy requirements over temperature while drawing only 10 to 20 uA from the power bus.

Therefore, no previously known prior art involving low speed oscillators provides a frequency accuracy of ±0.1% over a wide temperature range while drawing low power, quick start-up, and can survive a high g environment in a reliable manner.

SUMMARY OF THE INVENTION

It is a primary object of this invention to produce a new and improved low power oscillator that could be used in fuzes or other applications to count down a programmable time accurately.

It is another primary object of this invention to produce a new and improved oscillator apparatus which provides highly accurate signals (maximum frequency error of ±0.1%) over wide climatic conditions (−40° C. to +55° C.), while drawing a low amount of power (between 15 uA and 20 uA at a supply voltage of 3.3 volts).

Another significant object of the invention is to provide an oscillator apparatus capable of surviving a high g environment of 30,000 to 50,000 g in a reliable manner.

Yet another object of the invention is to provide a low power oscillator circuit with a fast start up time of 1.5 msec maximum at a supply voltage of 3.3 volts.

Yet still another significant object of the invention is to provide an oscillator which operates at low frequencies (8 kHz minimum), whose output voltage can swing rail to rail (within 100 millivolts), and in which all components used must be available in die form.

The invention will be better understood and objects other than those set forth above will become apparent when consideration is given to the following detailed description thereof. Such description makes reference to the annexed drawings wherein throughout the various figures of the drawings, there have been generally used the same reference terminology to denote the same or analogous components and specifically wherein:

DETAILED DESCRIPTION OF THE PREFERRED EMBODIMENTS

Figure 1:
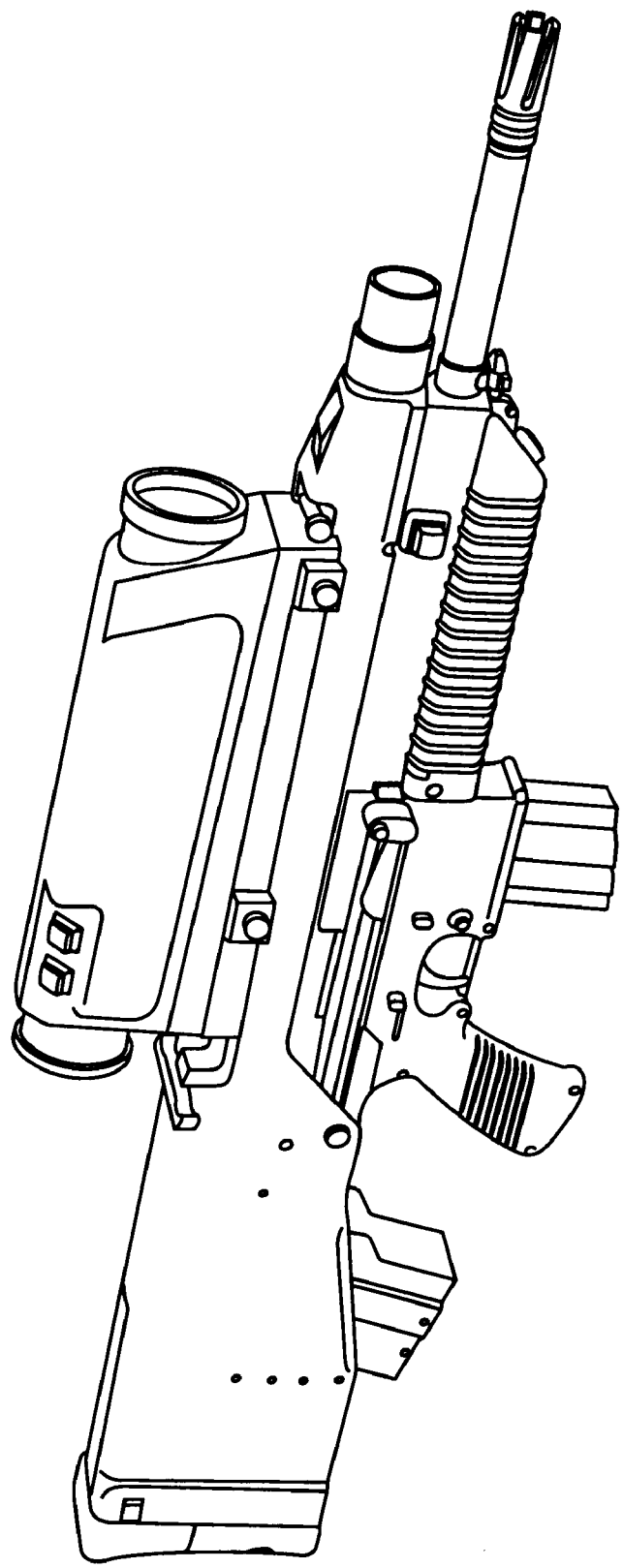
FIG. 1 is a top, right-side perspective view of a combination weapon which incorporates the ultra low-power fast-start precision oscillator according to the present invention.
Figure 2:
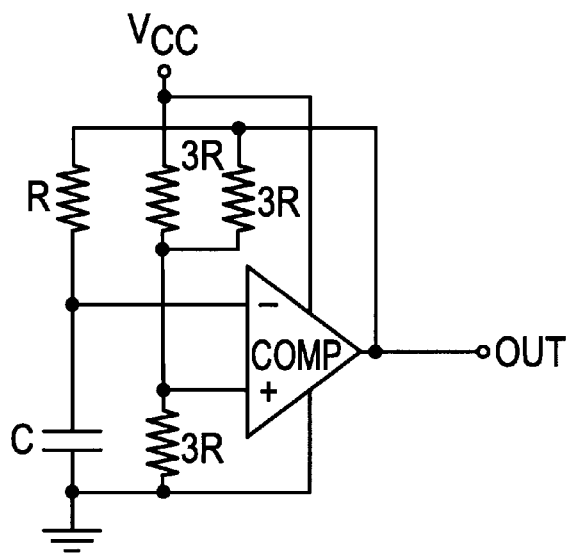
FIG. 2 is a schematic circuit diagram showing the components which comprise the ultra low power fast-start precision oscillator.

A combination weapon incorporating the ultra low-power fast-start precision oscillator according to the present invention is shown in FIG. 1. The basic oscillator circuit, as shown in FIG. 2, functions as follows. When power is first applied, the timing capacitor C and the negative input of the comparator (−) are at zero volts. The positive comparator input (+) rises to some positive voltage and since the negative input is at a lower voltage, the output voltage then swings to the positive +Vcc rail. This places ⅔ Vcc on the positive input of the comparator. (With voltage at the output at +Vcc, the two 3R resistors connected to Vcc effectively appear in parallel, (3R×3R)/(3R+3R)=1.5 R. In addition, there is one 3R resistor connected between the positive input and ground. Therefore, the Vcc voltage is divided across 1.5 R and the 3R to ground, putting a voltage of ⅔ Vcc at the positive input pin of the comparator).

Capacitor C then begins to charge through timing resistor R. When the voltage across capacitor C exceeds ⅔ Vcc, the voltage on the negative input exceeds the voltage on the positive input and the Output of the comparator swings to the negative rail (which is at ground potential). This places ⅓ Vcc at the positive input pin. (There are three 3R resistors connected to the positive input. One is tied to Vcc and the other two are now tied to ground. The two tied to ground appear in parallel to the positive input, effectively equal to 1.5R in resistance to ground. Therefore, the Vcc voltage is divided across the 3R resistor and then the effective 1.5 R resistor, producing ⅓ Vcc at the positive input.

Next, the voltage across the timing resistor also switches from Vcc to ground potential which causes the timing capacitor to discharge. When its level drops below ⅓ Vcc, the output of the comparator switches again to Vcc and the cycle repeats.

Each charge and discharge takes 0.693×RC, where RC equals one time constant. Thus, each cycle of the RC oscillator takes 2×0.693×RC, which equals a frequency of 0.72/RC.

Theoretically, the oscillator operates stably after just one cycle time (the first half cycle takes about twice as long as normal because the capacitor has to swing through a delta of 0 volts to ⅔ Vcc instead of the normal delta of ⅓ Vcc. Thus, in a preferred embodiment, an 8 kHz oscillator should reach stable operation within 0.125 msec. Also, the oscillator frequency should be relatively immune to power supply changes since all variables are referenced to Vcc.

There are two sources of oscillator power draw, passive and active current draw. Passive current drain is controlled strictly by the resistors (see FIG. 2). The higher the value of resistor selected, the lower the current draw. The biasing resistors used in the ultra low-power fast-start precision oscillator are set to a value of 3R, three times the value of the timing resistor. Since they are in parallel as far as the equivalent source resistance seen by the positive input of the comparator is concerned, the source resistances are made equal for both inputs. This cancels out the first order effects of common comparator input bias current.

Under a DC analysis of the circuit, two of the three resistors are always in parallel and this parallel combination is in series with the third. This results in an equivalent resistance of (1.5+3)×R=4.5×R across the Vcc power buss. Thus, the DC current drawn is Vcc/(4.5×R) for this group of resistors.

The timing resistor R sets the charging current which charges timing capacitor C. Since this current is equal to ⅔×(Vcc/R) at the beginning of the charge cycle and ⅓×(Vcc/R) at the end of the charge cycle, the average current drawn during charge and discharge of the capacitor is ½×Vcc/R. Thus, the total DC current draw is (½×Vcc/R)+Vcc/(4.5×R)=2.22×(Vcc/R). In a preferred embodiment, R=200K and Vcc=3.3 volts. Therefore, the current drawn by the oscillator, $i_d$=3.3/300 Kohms, or about 10 uA.

Raising the value of R will decrease the current drawn by the oscillator, $i_d$. However, there is a limitation on how far R can be increased to decreases current. Since, offset bias current error over temperature is proportional to resistor value, it will increase as resistor value increases. Also, there is a decreasing availability of stable resistors in the Megohm range.

Since high resistance is required, a relatively low value must be selected for the capacitor. In a preferred embodiment, at a frequency=8 kHz and R=300 Kohms, C=300 pF. In this capacitance temperature range, zero coefficient capacitors are readily available in chip form.

Figure 3:
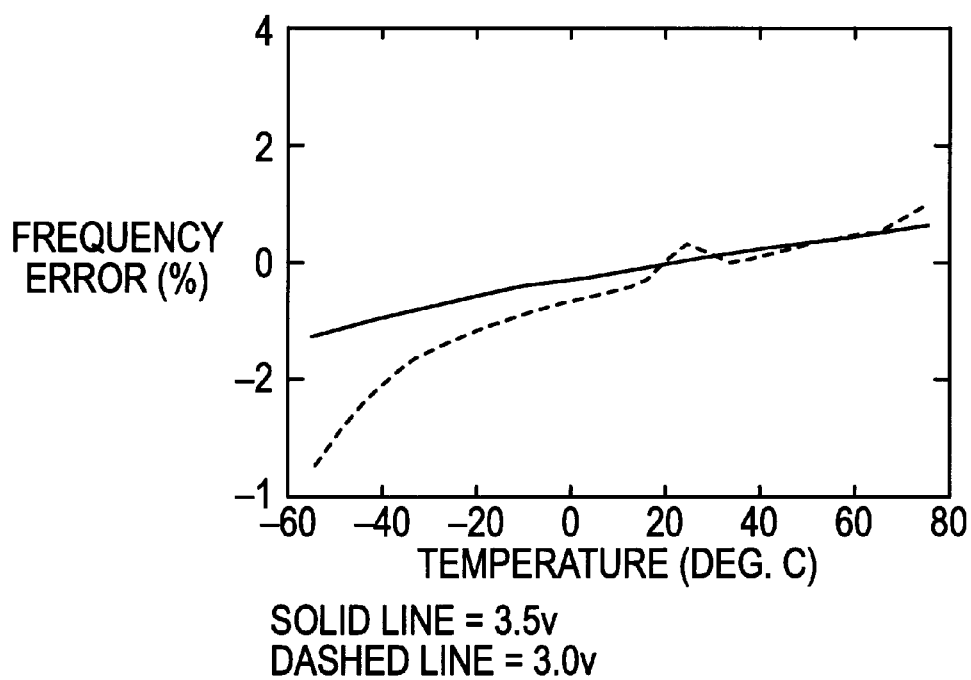
FIG. 3 is a plot of RC oscillator frequency error versus temperature for a supply voltage of 3.5 volts and a supply voltage of 3.0 volts.

The only active component used in the oscillator circuit is the comparator. In a preferred embodiment, a MAX921/931 comparator was used. It achieved the desired frequency accuracy at ambient temperature, while only drawing 4 uA of current at 3.3 volts. One problem encountered by using the MAX921/931 comparator in the oscillator circuit was the resultant oscillator frequency error encountered over temperature. The oscillator frequency error was about ±1.0% for a Vcc of 3.5 volts and about ±2.0% for a Vcc of 3.0 volts over a temperature range of −40° C. to +60° C. (see FIG. 3). The desired frequency error is ±0.1% over a −40° C. to +60° C. temperature range. Using a supply voltage of 3.3 volts resulted in a frequency error of ≤±0.1% over the desired temperature range. As a result, it was decided that a 3.3 volt supply voltage would be used even though this resulted in increased current draw.

Figure 4:
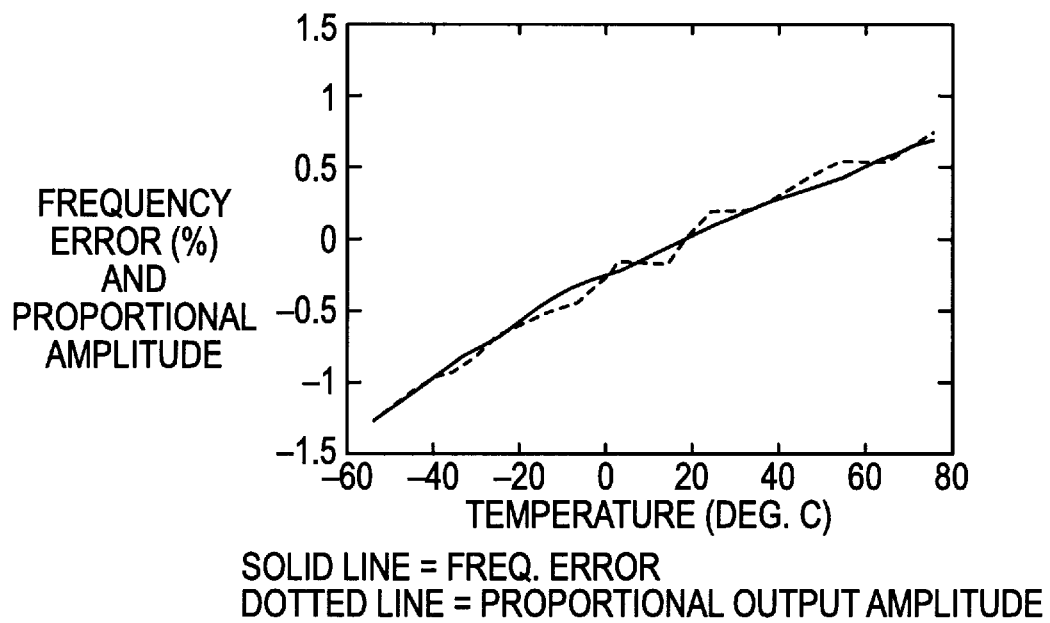
FIG. 4 is a plot of how output voltage swing varies with temperature.
Figure 5:
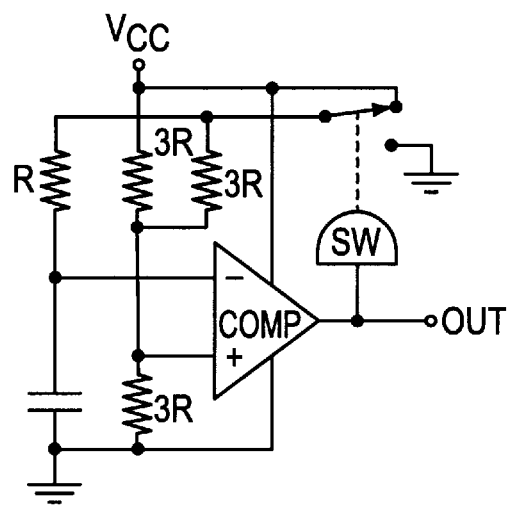
FIG. 5 is a schematic circuit diagram showing the components which comprise the ultra low-power fast-start precision oscillator in which an analog switch is incorporated to eliminate the effects of output voltage variation with temperature.

Analysis of test data indicated that part of the frequency error was due to the output voltage swing changing with temperature. FIG. 4 shows a strong correlation between change in output voltage swing and temperature. This correlation appeared to be the result of a basic semiconductor effect related to diode drop. Three solutions for improving oscillator accuracy versus temperature were investigated: (1) Incorporation of an analog switch (see FIG. 5) to eliminate the effects of output voltage variation; (2) Measurement of the actual voltage variations (via a sampling A/D converter) and subsequent software correction; and (3) compensation using diode drop correction.

Figure 6:
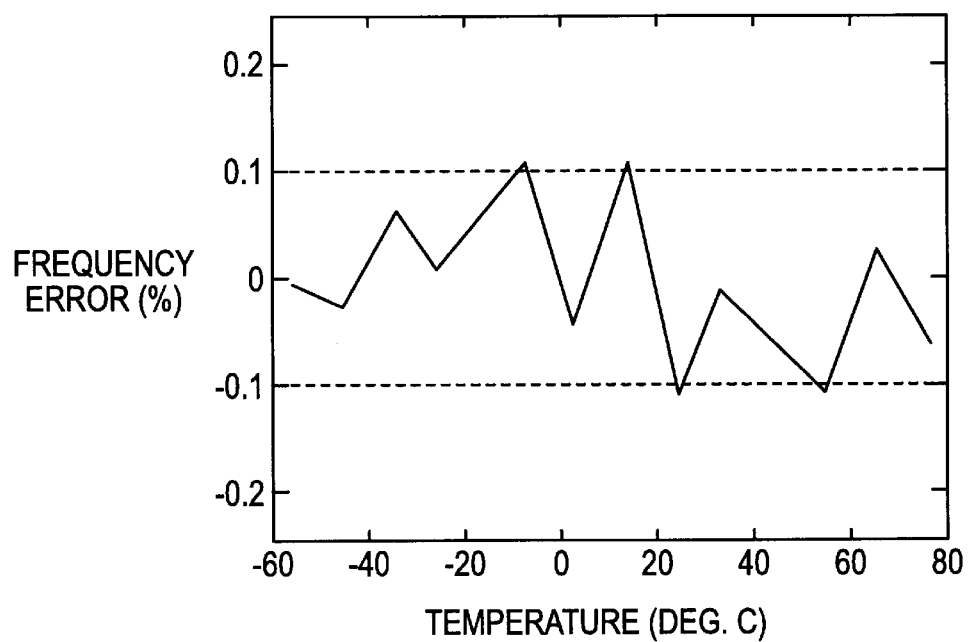
FIG. 6 is a plot of frequency error versus temperature for the RC oscillator when the actual output voltage variations over temperature are measured and then compensated for using subsequent software correction.
Figure 7:
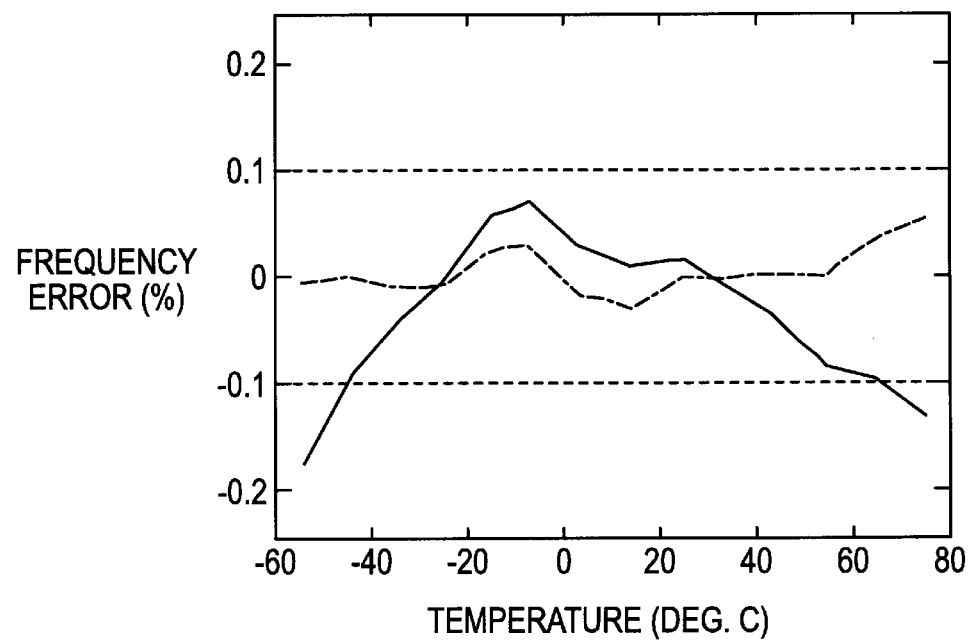
FIG. 7 is a plot of frequency error versus temperature for the RC oscillator when a diode is used to compensate for output voltage variation over temperature.

All three approaches were analyzed and tested. Incorporation of an analog switch improved oscillator accuracy, but did not completely eliminate output voltage swing variation versus change in temperature. This is probably because of the effect of other sources of error within the comparator (such as gain variation and threshold values). Output level compensation is shown in FIG. 6. While it works well, it requires additional circuitry, which in turn, raises the cost and current consumption. The results using the diode compensation approach are shown in FIG. 7. The dash-dotted curve shows theoretical diode compensation and the solid curve represents the result when using the temperature sensing output of a MAXI882 regulator which has an internal diode drop. Both approaches reduced the frequency error over temperature to less than ±0.1% as shown. As in the case of the MAXI882, a diode temperature output is sometimes provided as part of monolithic IC regulators and, therefore, can be used with no additional hardware or power dissipation.

A fourth method of temperature compensation tested was first to measure the oscillator frequency over the temperature range, and then subsequently correct the output frequency. This can be done readily if a suitable reference and sufficient time are available. For example, one convenient reference that can be used is the fuze setting data transfer event. This approach was analyzed using the software package MATH-CAD. The error was determined using analog methods. Satisfactory performance was predicted.

A variation of the above approach, which was implemented, was to count internal high speed oscillator cycles during data transfer and then correct for frequency error in the software. The lower frequency clock is then checked against the now calibrated high speed clock and a resulting net correction is made to the commanded (transferred) time out data.

Figure 8:
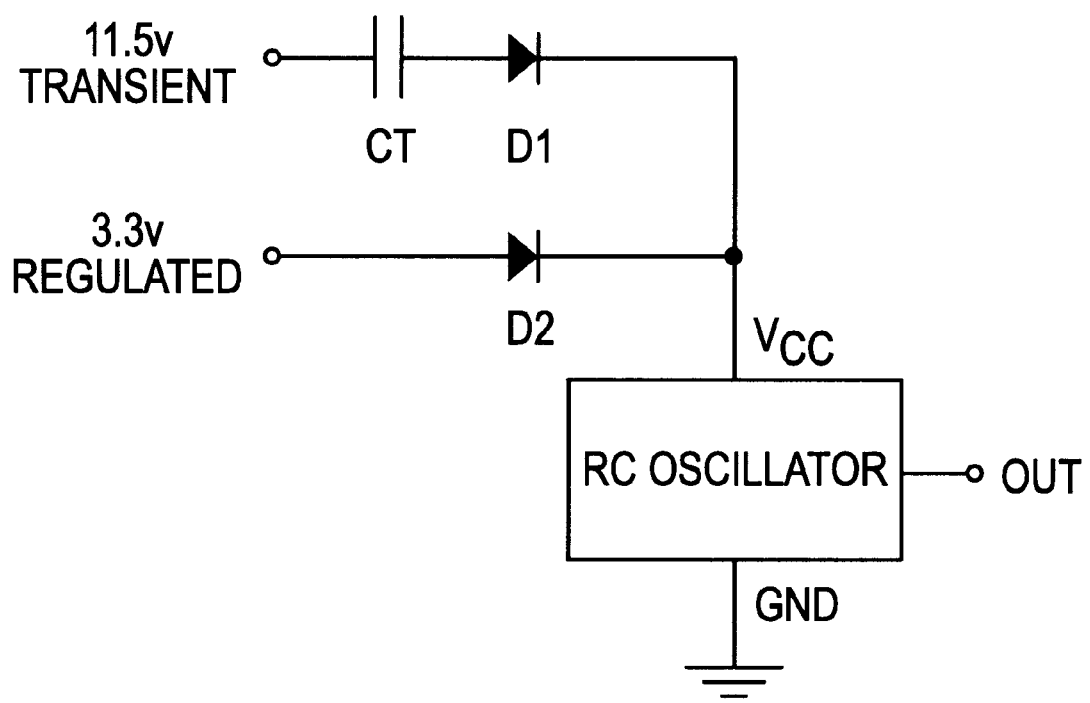
FIG. 8 is a schematic circuit diagram of a jump start circuit for the RC oscillator according to the present invention.

A second problem encountered when using the MAX921/931 was start-up time. Since start-up time is Vcc dependent, the higher the supply voltage, the faster the start-up time. Therefore, a start-up scheme was used in which the supply voltage is first connected to 11.5 volts for a few milliseconds (for fast start-up) and then allowed to discharge down to about 3.3 volts. This circuit is illustrated in FIG. 8. The oscillator is "jump started" by applying 11.5 volts at start-up through Ct, which is initially uncharged. After a few milliseconds (the exact amount of time depends on the size of the capacitor relative to the RC oscillator current drawn), the capacitor charges and the supply voltage drops back to the normal operating voltage of 3.3 volts (less a diode drop). The diodes D1 and D2 are Schottky types. A MOS switch could even be used if a lower voltage drop across D2 is desired.

In another preferred embodiment, a Maxim MAX954 was selected as the comparator. It draws 9 uA of quiescent current at 3.3 volts. Although the MAX954 draws 5 uA more current than the MAX921/931 (4 uA at 3.3 volts), it has a faster start-up time and therefore, does not require the circuit shown in FIG. 8.

The resulting ultra low-power fast-start precision oscillator design uses either about 15 uA (in the start-up compensated version) or 20 uA (in the uncompensated version). Both versions start quickly and can be compensated to perform over a broad temperature range with a frequency accuracy of less than ±0.1%. IHowever, they both have to be trimmed to eliminate set errors due to timing capacitor tolerances and initial comparator offsets.

While there are shown and described present preferred embodiments of the invention, it is distinctly understood that the invention is not limited thereto, but may be otherwise variously embodied and practiced within the scope of the following claims.

What we claim as our invention is:

1. An oscillator apparatus comprising a comparator having a negative input, a positive input, a positive voltage supply input ($V_{CC}$), a negative voltage supply input ($-V_{CC}$) and an output, a timing capacitor, a timing resistor having a first end and a second end, and a first, a second and a third biasing resistor, each having a first and a second end;

said timing resistor is connected between and is electrically coupled to said output of said comparator and said negative input of said comparator;

said first biasing resistor is connected between and electrically coupled to said positive input of said comparator and said negative supply voltage input of said comparator;

said second of said biasing resistors is connected between and electrically coupled to said positive input of said comparator and said positive supply voltage input of said comparator;

said third of said biasing resistors is connected between and electrically coupled to said positive input of said comparator and said output of said comparator;

said timing capacitor is connected between and electrically coupled to said negative supply voltage input and said negative input of said comparator, whereby when the circuit is energized, the output voltage appearing on the output of said comparator swings between $+V_{CC}$ and $-V_{CC}$ with a frequency equal to 0.72/RC, where R equals the resistance of said timing resistor and C equals the capacitance of said timing capacitor; and a capacitor having two terminals and a first diode having a cathode and an anode and a second diode having an anode and a cathode;

one terminal of said capacitor is connected to 11.5 volts and the second terminal of said capacitor is connected to said anode of said first diode;

said cathode of said first diode is connected and electrically coupled to said positive supply voltage input of said comparator;

said anode of said second diode is connected and electrically coupled to 3.3 volts and said cathode of said second diode is connected and electrically coupled to said positive supply voltage input of said comparator, whereby the supply voltage is first connected to 11.5 volts for a few milliseconds (for fast start-up) and then falls to 3.3 volts (less a diode drop).

2. The oscillator circuit as recited in claim 1 wherein said second diode is a MOS switch.

3. The oscillator apparatus according to claim 1, where each of said biasing resistors equals the same resistance value, and each of said biasing resistors equals three times the resistance of said timing resistor.

4. The oscillator apparatus according to claim 1, where said camparator is a low power comparator.

5. An oscillator apparatus comprising a comparator having a negative input, a positive input, a positive voltage supply input ($V_{CC}$), a negative voltage supply input ($-V_{CC}$) and an output, a timing capacitor, a timing resistor having a first end and a second end, and a first, a second and a third biasing resistor, each having a first and a second end;

said timing resistor is connected and is electrically coupled to said negative input of said comparator;

said first biasing resistor is connected between and electrically coupled to said positive input of said comparator and said negative supply voltage input of said comparator;

said second of said biasing resistors is connected between and electrically coupled to said positive input of said comparator and said positive supply voltage input of said comparator;

said third of said biasing resistors is connected and electrically coupled to said positive input of said comparator;

said timing capacitor is connected between and electrically coupled to said negative supply voltage input and said negative input of said comparator, whereby when the circuit is energized, the output voltage appearing on the output of said comparator swings between $+V_{CC}$ and $-V_{CC}$ with a frequency equal to 0.72/RC, where R equals the resistance of said timing resistor and C equals the capacitance of said timing capacitor;

a switch having an input, a first and a second output and a control port;

said input of said switch is connected and electrically coupled to the end of said timing resistor not connected or electrically coupled to said negative input of said comparator and to the end of said third biasing resistor not connected or electrically coupled to said positive input of said comparator;

said first output of said switch is connected and electrically coupled to ground potential;

said second output of said switch is connected and electrically coupled to said positive supply voltage; and the control port of said switch is connected and electrically coupled to said output of said comparator.

* * * * *